(12) United States Patent
Yakiyama et al.

(10) Patent No.: US 7,275,314 B2
(45) Date of Patent: Oct. 2, 2007

(54) ELECTRONIC COMPONENT MOUNTING APPARATUS AND ELECTRONIC COMPONENT MOUNTING METHOD

(75) Inventors: Hideyuki Yakiyama, Chikushino (JP); Yasuhiro Emoto, Fukuoka (JP); Tadashi Shinozaki, Ogori (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 265 days.

(21) Appl. No.: 11/088,112

(22) Filed: Mar. 23, 2005

(65) Prior Publication Data
US 2005/0210667 A1  Sep. 29, 2005

(30) Foreign Application Priority Data
Mar. 26, 2004  (JP)  ............ P2004-091474

(51) Int. Cl.
*H05K 3/30* (2006.01)
(52) U.S. Cl. ............ 29/832; 29/740; 29/833; 29/834; 29/720
(58) Field of Classification Search .......... 29/739, 29/740, 743, 832–836, 720, 712; 250/559.44; 356/614; 382/145
See application file for complete search history.

(56) References Cited

U.S. PATENT DOCUMENTS 6,792,676 B2 * 9/2004 Haji et al. .......... 29/832
7,102,148 B2 * 9/2006 Kodama et al. .......... 29/833

FOREIGN PATENT DOCUMENTS

| JP | 2725702 | 12/1997 |
|---|---|---|
| JP | 2003-188194 | 7/2003 |
| JP | 3511841 | 1/2004 |

\* cited by examiner

*Primary Examiner*—Minh Trinh
*Assistant Examiner*—Donghai D. Nguyen
(74) *Attorney, Agent, or Firm*—Pearne & Gordon LLP

(57) ABSTRACT

In an electronic component mounting apparatus for taking out a chip 6 from a component supply portion 4 to mount to a board 16 held by a board holding portion 10, an image of a supply portion reference mark provided at a mark post 18 of the component supply portion 2 is taken by a second camera 35 moved by a camera moving mechanism, a camera coordinates system is calibrated based on a result of taking the image, thereafter, a position of the chip 6 is recognized by the second camera 35 and the chip 6 is picked up by a mounting head based on a result of the recognition. Thereby, stable pick up accuracy can be ensured by calibrating an aging variation of the coordinates system owing to thermal elongation or contraction of the camera moving mechanism.

9 Claims, 14 Drawing Sheets

$$x_R = \frac{x_b - x_r}{x_b - x_a} x_A + \frac{x_r - x_a}{x_b - x_a} x_B \quad \text{-----} \quad (1)$$

$$y_R = \frac{y_b - y_r}{y_b - y_a} y_A + \frac{y_r - y_a}{y_b - y_a} y_B \quad \text{-----} \quad (2)$$

ELECTRONIC COMPONENT MOUNTING APPARATUS AND ELECTRONIC COMPONENT MOUNTING METHOD

BACKGROUND OF THE INVENTION

The present invention relates to an electronic component mounting apparatus and an electronic component mounting method for mounting an electronic component on a circuit board.

An electronic component supplied in a state of a semiconductor wafer of a semiconductor chip or the like is mounted on a circuit board of a lead frame or the like by an electronic component mounting apparatus having a supply apparatus exclusive for taking out a semiconductor chip in a state of being adhered on a sheet. According to the supply apparatus, in order to pick up the electronic component adhered on the sheet without a positional shift, an image of the electronic component constituting an object of pick up by a component recognizing camera to recognize a position thereof (refer to, for example, Japanese Patent 3511841).

According to the Japanese Patent, there is constructed a constitution in which the camera is fixedly arranged on an upper side of a moving table holding the semiconductor wafer and moving in a horizontal face, and in pick up operation of taking out the electronic component, the moving table is driven based on a result of recognizing the position by the component recognizing camera and the electronic component constituting the object of pick up is positioned to a pick up position set at a fixed position.

In recent years, with an object of promoting productivity of an electronic component mounting apparatus, in place of the above-described constitution of the prior art example, there is adopted an electronic component mounting apparatus having a constitution of taking out an electronic component from a component supply portion an XY position of which is fixed. According to such a constitution, a position of picking up the electronic component is not fixed and the electronic component is picked up from an arbitrary position on a sheet. Therefore, according to the above-described constitution, there is adopted a constitution having a camera moving mechanism which moves the camera for recognizing the position of the electronic component at the component supply portion to an arbitrary position.

However, according to the above-described constitution of moving the camera, a variation in position recognizing accuracy is brought about in recognizing the electronic component by the camera by being caused by a variation in a relative relationship between a camera coordinates system and a machine coordinates system of the mounting apparatus by a mechanism error of aging thermal elongation or contraction of a mechanism element of a ball screw or the like constituting the camera moving mechanism. Further, when the electronic component is picked up based on the unstable result of detecting the position, there is a problem that a failure in pick up is liable to be brought about by a positional shift. Further, the problem becomes particularly significant with an increase in a distance of moving the camera by large-sized of the semiconductor wafer.

SUMMARY OF THE INVENTION

It is an object of the invention to provide an electronic component mounting apparatus capable of picking up an electronic component from a component supply portion with stable pick up accuracy.

According to the invention, an electronic component mounting apparatus mounts an electronic component supplied by a component supply portion on a board, the electronic component mounting apparatus comprising the component supply portion which supplies the electronic component in a predetermined arrangement and provided with a supply portion reference mark related to a reference position of the electronic component, a board holding portion which holds the board, a component mounting mechanism which mounts the electronic component taken out from the component supply portion by a take out head to the board held by the board holding portion by a mounting head, a supply portion imaging camera which takes an image of the electronic component at the component supply portion, a supply portion imaging camera moving means which horizontally movies the supply portion imaging camera relative to the component supply portion, a supply portion reference mark imaging camera which takes an image of the supply portion reference mark, and a controller which controls the component mounting mechanism based on a result of the image taken by the supply portion imaging camera and controlling the supply portion imaging camera moving means based on a result of the image taken by the supply portion reference mark imaging camera.

According to the invention, an electronic component mounting method of mounting an electronic component supplied by a component supply portion to mount on a board by an electronic component mounting apparatus comprising the component supply portion which supplies the electronic component in a predetermined arrangement and provided with a supply portion reference mark related to a reference position of the electronic component, a board holding portion which holds the board, a component mounting mechanism which mounts the electronic component taken out from the component supply portion by a take out head to the board held by the board holding portion by a mounting head, a supply portion imaging camera which takes an image of the electronic component at the component supply portion, a supply portion imaging camera moving means which horizontally moves the supply portion imaging camera relative to the component supply portion, and a supply portion reference mark imaging camera which takes an image of the supply portion reference mark, wherein the component mounting mechanism is controlled based on a result of the image taken by the supply portion imaging camera and the supply portion imaging camera moving means is controlled based on a result of the image taken by the supply portion reference mark imaging camera.

According to the invention, by providing the supply portion reference mark related to the reference position of the electronic component at the component supply portion and moving the supply portion imaging camera relative to the component supply portion based on a result of recognizing the supply portion reference mark, the electronic component can be picked up from the component supply portion with stable pick up accuracy by excluding a mechanism error owing to an aging variation of the moving means which moves the supply portion imaging camera.

DETAILED DESCRIPTION OF THE PREFERRED EMBODIMENTS

Figure 1:
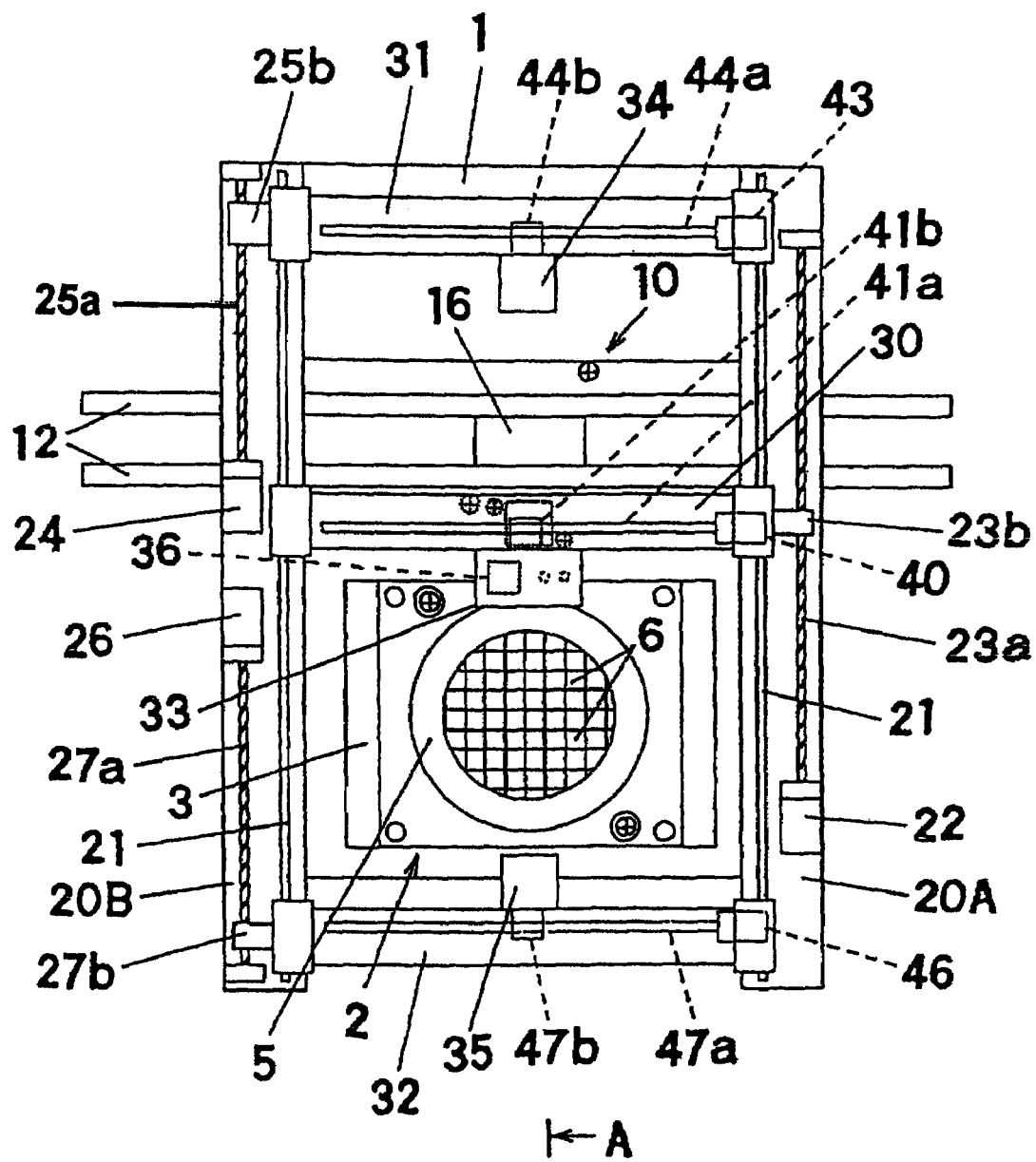
FIG. 1 and FIG. 2 are plane views of an electronic component mounting apparatus according to the embodiment of the invention.

Next, an embodiment of the invention will be explained in reference to the drawings as follows. First, a total structure of an electronic component mounting apparatus will be explained in reference to FIG. 1, FIG. 2, and FIG. 3. FIG. 3 shows a sectional view taken along a line A-A of FIG. 1. In FIG. 1, a component supply portion 2 is arranged on a base 1. As shown by FIG. 3, the component supply portion 2 is provided with a wafer holding table 3 and the wafer holding table 3 attachably and detachably holds a wafer ring 5 constituting a sheet holding member.

A semiconductor chip 6 (hereinafter, simply abbreviated as "chip 6") constituting an electronic component is adhered on a sheet 5a (refer to FIG. 4) stretched on the wafer ring 5 in a state of being separated piece by piece. That is, the chip 6 is provided to the component supply portion 2 in the state of being adhered on the sheet 5a stretched on the wafer ring 5, and in the state of holding the wafer ring 5 by the wafer holding table 3, the component supply portion 2 supplies the chip 6 in a predetermined arrangement on a plane.

As shown by FIG. 3, an ejector 8 is arranged on a lower side of the wafer ring 5 held by the wafer holding table 3 movably in a horizontal direction by an ejector XY table 7. The ejector 8 is provided with a pin moving up and down mechanism for moving up and down an ejector pin (not illustrated) for pushing up the chip, and in picking up the chip 6 by a mounting head, mentioned later, by pushing the chip 6 from a lower side of the wafer ring 5 by the ejector pin, the chip 6 is exfoliated from the sheet 5a stretched on the wafer ring 5. The ejector 8 constitutes a sheet exfoliating mechanism for exfoliating the chip 6 from the sheet 5a stretched on the wafer ring 5.

Further, the sheet exfoliating mechanism is not limited to the ejector 8 shown here but the sheet exfoliating mechanism is sufficed by a mechanism capable of exfoliating the chip from the sheet 5a. For example, it is possible to adopt a mechanism of sucking the sheet 5a adhered with the chip 6 from a lower side and exfoliating the chip 6 from the sheet 5a by a sucking force.

Figure 4A:
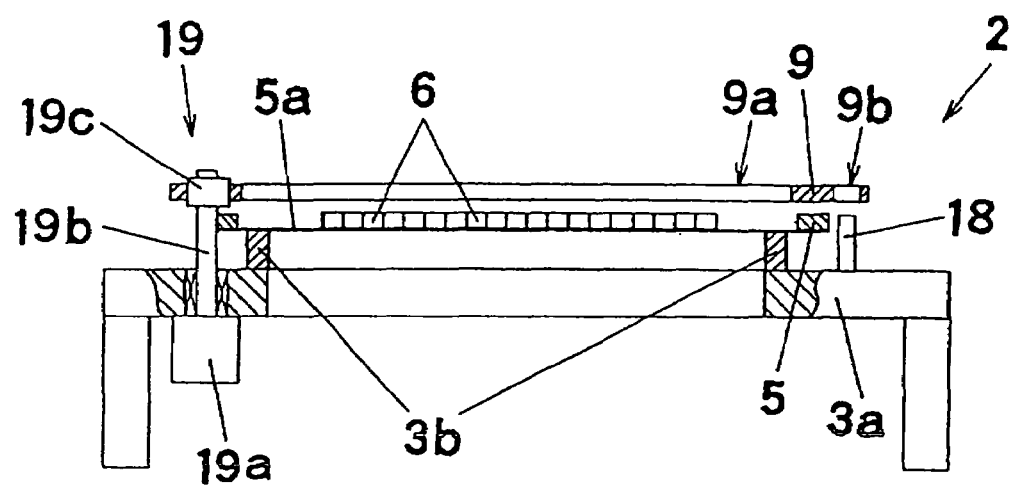
FIGS. 4A and 4B illustrate partially sectional views of a component supply portion of the electronic component mounting apparatus according to the embodiment of the invention.

Next, a structure of the component supply portion 2 will be explained with reference to FIGS. 4A and 4B. In FIG. 4A, a base plate 3a at an upper face of the wafer holding table 3 is constituted by a shape provided with a circular opening portion at a center portion thereof, and an expand ring 3b constituting a cylindrical member is erected at the upper face of the base plate 3a along the opening portion. In a state of mounting the wafer ring 5 to the wafer holding table 3, the expand ring 3b is brought into contact with a lower face of the sheet 5a stretched on the wafer ring 5.

A moving up and down plate 9 provided with a circular opening portion 9a having a size in correspondence with that of the expand ring 3b at a center portion thereof is arranged on an upper side of the expand ring 3b movably in an up and down direction by a moving up and down mechanism 19. The moving up and down mechanism 19 is constructed by a constitution in which a feed screw 19b driven to rotate by a motor 19a is screwed to a nut 19c coupled to the moving up and down plate 9 and the moving up and down plate 9 is moved up and down relative to the base plate 3a by driving the motor 19a.

Figure 4B:
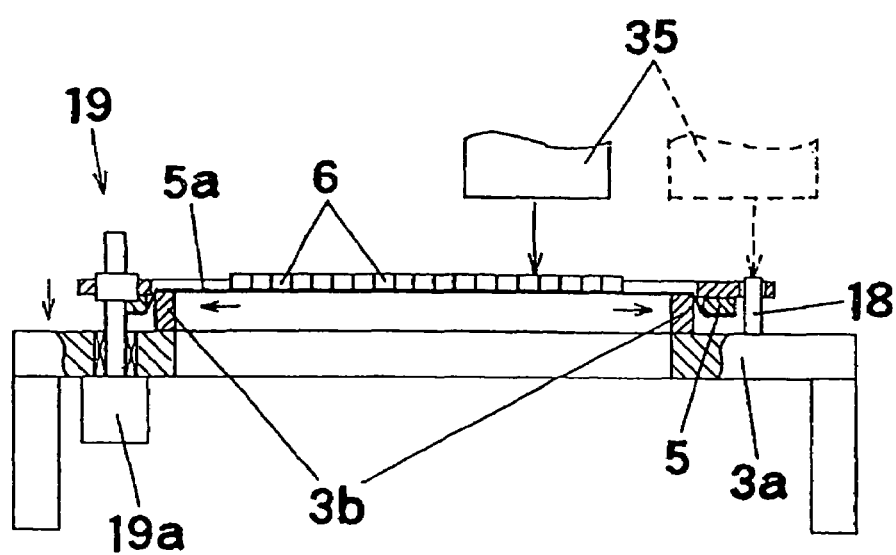

As shown by FIG. 4B, by moving down the moving up and down plate 9 in a state of mounting the wafer ring 5 to the wafer holding table 3 by the moving up and down mechanism 19, the wafer ring 5 is pressed to a lower side by the moving up and down plate 9. Thereby, the sheet 5a brought into contact with a top portion of the expand ring 3b is pulled to expand in a horizontal plane, the chips 6 contiguous to each other at the upper face of the sheet 5a are separated from each other, and pieces of the chip 6 can be sucked to be held by a take out head to be taken out.

Figure 5A:
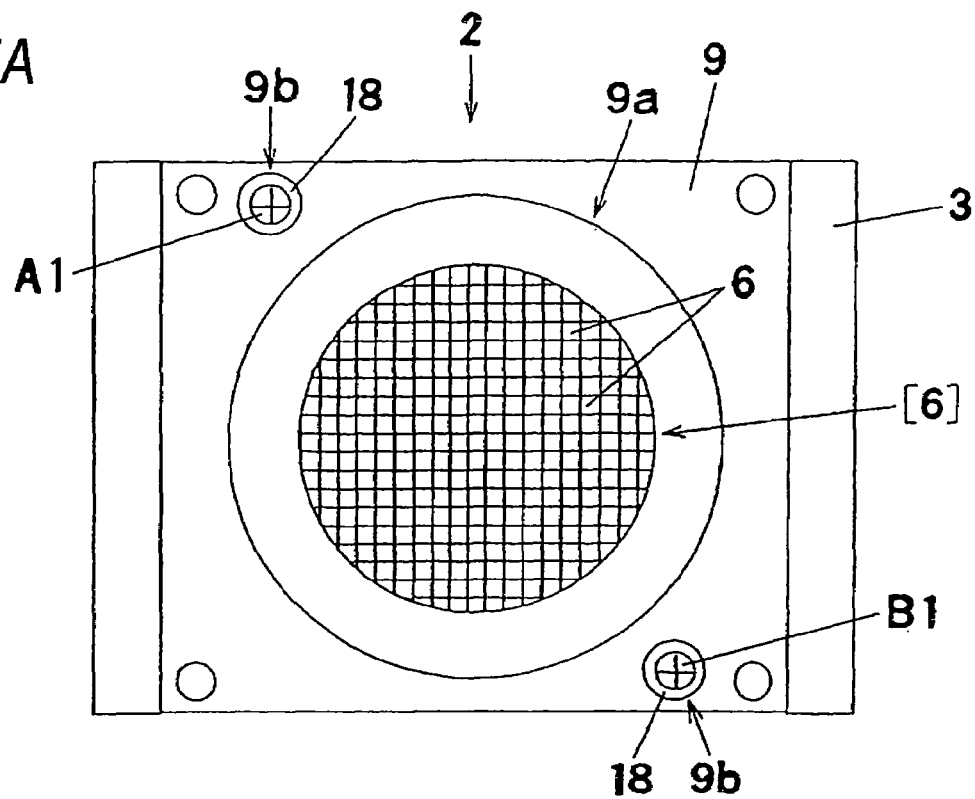
FIGS. 5A and 5B illustrate explanatory views of a supply portion reference mark of the electronic component mounting apparatus according to the embodiment of the invention.

Mark posts 18 in a shape of two columns are erected at a plurality of portions interposing the expand ring 3b constituting the cylindrical member therebetween are erected at the upper face of the base plate 3a (refer to FIG. 5A). The upper faces of the mark posts 18 are provided with recognizing marks A1, B1 as supply portion reference marks. The moving up and down plate 9 is provided with an opening 9b in correspondence with a position of the mark post 18, and as shown by FIG. 4B, images of the recognizing marks A1, B1 can be taken out by a second camera 35 for taking an image of the chip 6 in a state of being adhered on the sheet 5a via the openings 9b.

That is, since the mark posts 18 are provided at the base plate 3a, even when the moving up and down plate 9 is moved up and down, heights of focal points of the recognizing marks A1, B1 are not changed to maintain constant heights. Further, since the opening portions 9b are provided, even when the moving up and down plate is moved up and down, the images of the recognizing marks A1, B1 can be taken by the camera from the upper side without interfering the mark posts 18 with the moving up and down plate 9. By processing to recognize that the taken images of the recognizing marks A1, B1, as described later, data for processing to calibrate a coordinates system in moving the mounting head or the second camera 35 at the component supply portion 2 is acquired. Further, in FIG. 3, illustration of the mark posts 18 is omitted.

As shown by FIG. 1, a board holding portion 10 is arranged at a position remote from the component supply portion 2 on the upper face of the base 1 in Y direction. Board carrying portions 12 respectively comprising board carrying conveyors are aligned in X direction on an upstream side and on a downstream side of the board holding portion 10. The board 16 carried in from the upstream side is carried in and held by the board holding portion 10 by the board carrying portion 12. The board holding portion 10 positions the held board 16 at a mounting position and the chip 6 taken out from the component supply portion 2 is mounted to the positioned board 16. Further, the mounted board 16 is carried out to the downstream side by the board carrying portion 12.

In FIG. 1, at both end portions of the upper face of the board 16, a first Y axis base 20A, a second Y axis base 20B are aligned by directing longitudinal directions thereof in Y direction orthogonal to a board carrying direction. The upper faces of the first Y axis base 20A, the second Y axis base 20B, Y direction guides 21 are arranged in longitudinal directions substantially over total lengths thereof to constitute a mode of arranging the pair of Y direction guides 21 in parallel with each other and to interpose the component supply portion 2 and the board holding portion 10.

Three beam members of a first beam member 31, a center beam member 30 and a second beam member 32 of a both ends supporting type both end portions of which are supported by the Y direction guides 21 are hung on the pair of Y direction guides 21 respectively slidably in Y direction. A nut member 23b is projected from a side end portion of a right side of the center beam member 30, and a feed screw 23a screwed to the nut member 23b is driven to rotate by a Y axis motor 22 arranged on the first Y axis base 20A in a horizontal direction. By driving the Y axis motor 22, the center beam member 30 is horizontally moved in Y direction along the Y direction guides 21.

Further, nut members 25b, 27b are respectively projected from side end portions on a left side of the first beam member 31, and the second beam member 32, and feed screws 25a, 27a screwed to the nut members 25b, 27b are respectively driven to rotate by Y axis motors 24, 26 arranged on the second Y axis base 20B in a horizontal direction. By driving the Y axis motors 24, 26, the first beam member 31 and the second beam member 32 are horizontally moved in Y direction along the Y direction guides 21.

The center beam member 30 is mounted with a mounting head 33, and a feed screw 41a screwed to a nut member 41b coupled to the mounting head 33 is driven to rotate by an X motor 40. By driving the X axis motor 40, the mounting head 33 is moved in X direction by being guided by a X direction guide 42 (refer to FIG. 3) provided in X direction at a side face of the center beam member 30.

The mounting head 33 is provided with a plurality (two in this case) of nozzles 33a each holding one piece of the chip 6, and is made to be movable in a state of holding the plurality of chips 6 by respectively sucking the chips 6 at the respective nozzles 33a. By driving the Y axis motor 22 and the X axis motor 40, the mounting head 33 is horizontally moved in X direction, Y direction, picks up to hold the chips 6 at the component supply portion 2 and mounts the held chips 6 to a component mounting position 16a of the board 16 held by the board holding portion 10.

Further, although, according to the mode, a single component holding head serves as both a take out head for taking out the chip 6 and the mounting head 33, a mechanism for picking up the chip having an exclusive take out head may separately be provided and the mounting head may receive the chip from the pick up mechanism to hold. Further, when a chip reversing mechanism is provided to the pick up mechanism, the mechanism can also deal with flip chip mounting of mounting the chip to the board by reversing head and tail thereof, which is preferable.

The pair of Y direction guides 21, the center beam member 30, a Y direction drive mechanism (Y axis motor 22, feed screw 23a and nut member 23b) for moving the center beam member 30 along the Y direction guides 21, and an X direction drive mechanism (X axis motor 40, feed screw 41a and nut member 40b) for moving the mounting head 33 along the X direction guide 42 constitute a mounting head moving mechanism for moving the mounting head 33 between the component supply portion 2 and the board holding portion 10. The mounting head 33 and the mounting head moving mechanism constitute a component mounting mechanism for mounting the chip 6 taken out from the component supply portion 2 by the take out head to the board 16 held by the board holding portion 10 by the mounting head 33.

The first beam member 31 is mounted with a first camera 34, and a nut member 44b is coupled to a bracket 34a for holding the first camera 34. A feed screw 44a screwed to the nut member 44b is driven to rotate by an X axis motor 43 and by driving the X axis motor 43, the first camera 34 is moved in X direction by being guided by an X direction guide 45 (refer to FIG. 3) provided at a side face of the first beam member 31.

By driving the Y axis motor 24 and the X axis motor 43, the first camera 34 is moved horizontally in X direction, Y direction. Thereby, the first camera 34 can move on an upper side of the board holding portion 10 for taking an image of the board 16 held by the board holding portion 10 and moved to escape from the upper side of the board holding portion 10. That is, the first camera 34 constitutes a board imaging camera for taking an image of the board 16 held by the board holding portion 10.

The pair of Y direction guides 21, the center beam member 30, a Y direction drive mechanism (Y axis motor 24, feed screw 25a and nut member 25b) for moving the first beam member 31 along the Y direction guides 21, an X direction drive mechanism (X axis motor 43, feed screw 44a and nut member 44b) for moving the first camera 34 along the X direction guide 45 constitute a first camera moving mechanism (board imaging camera moving mechanism) for moving the first camera 34 on the upper side of the board holding portion 10.

The second beam member 32 is mounted with a second camera 35, and a nut member 47b is coupled to a bracket 35a for holding the second camera 35. A feed screw 47a screwed to the nut member 47b is driven to rotate by an X axis motor 46, and by driving the X axis motor 46, the second camera 35 is moved in X direction by being guided by an X direction guide 48 (refer to FIG. 3) provided to a side face of the second beam member 32.

By driving the Y axis motor 26 and the X axis motor 46, the second camera 35 is moved horizontally in X direction, Y direction. Thereby, the second camera 35 can be moved on an upper side of the component supply portion 2 for taking an image of the chip 6 held by the component supply portion 2 and moved for escaping from the upper side of the component supply portion 2. That is, the second camera 35 constitutes a supply portion imaging camera for taking an image of the chip 6 at the component supply portion 2.

The pair of Y direction guides 21, the second beam member 32, a Y direction drive mechanism (Y axis motor 26, feed screw 27a and nut member 27b) for moving the second beam member 32 along the Y direction guides 21, and an X direction drive mechanism (X axis motor 46, feed screw 47a and nut member 47b) for moving the second camera 35 along the X direction guide 48 constitute a second camera moving mechanism (supply portion imaging camera moving mechanism) for horizontally moving the second camera 35 relative to the component supply portion 2.

Figure 2:
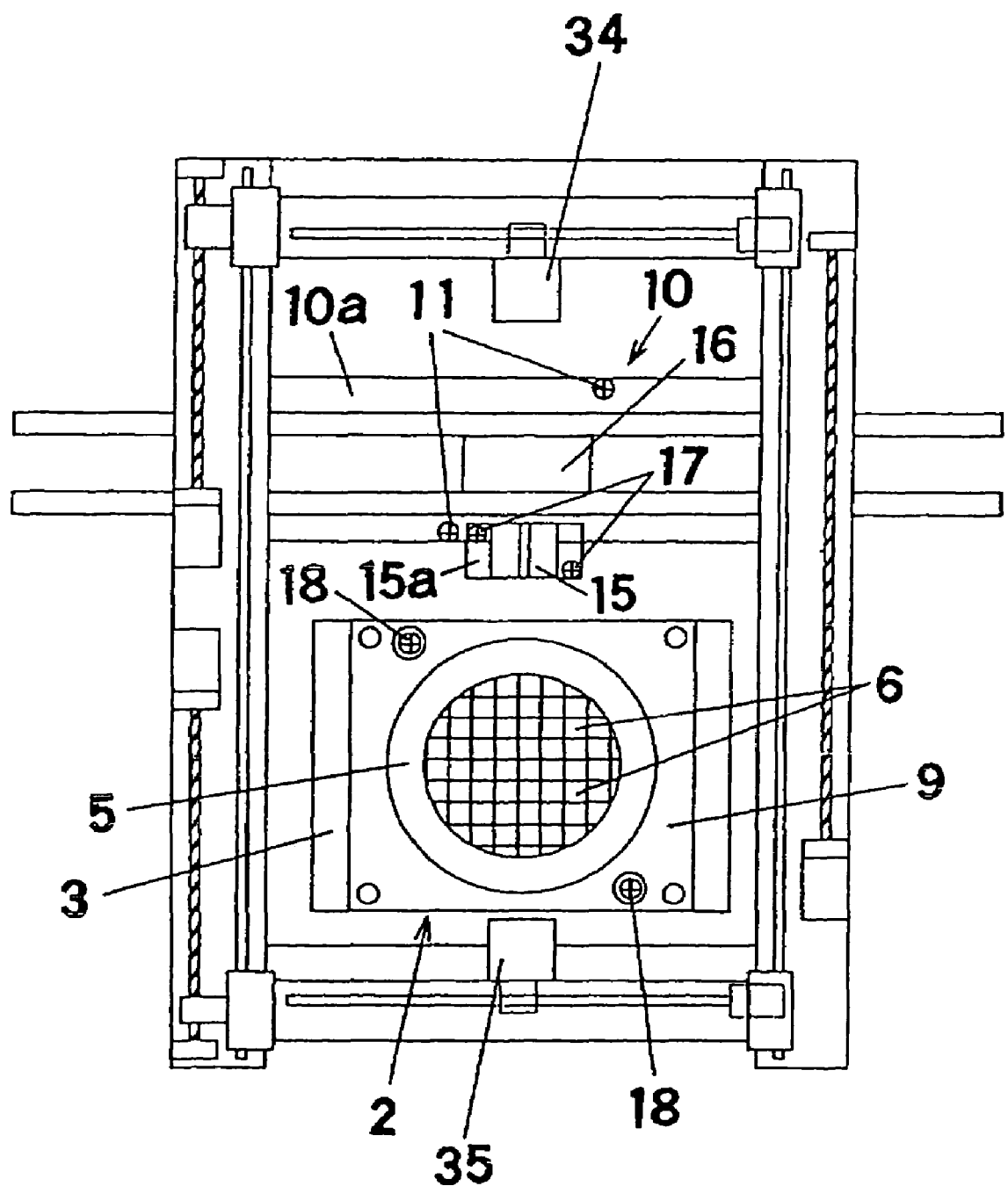
Figure 3:
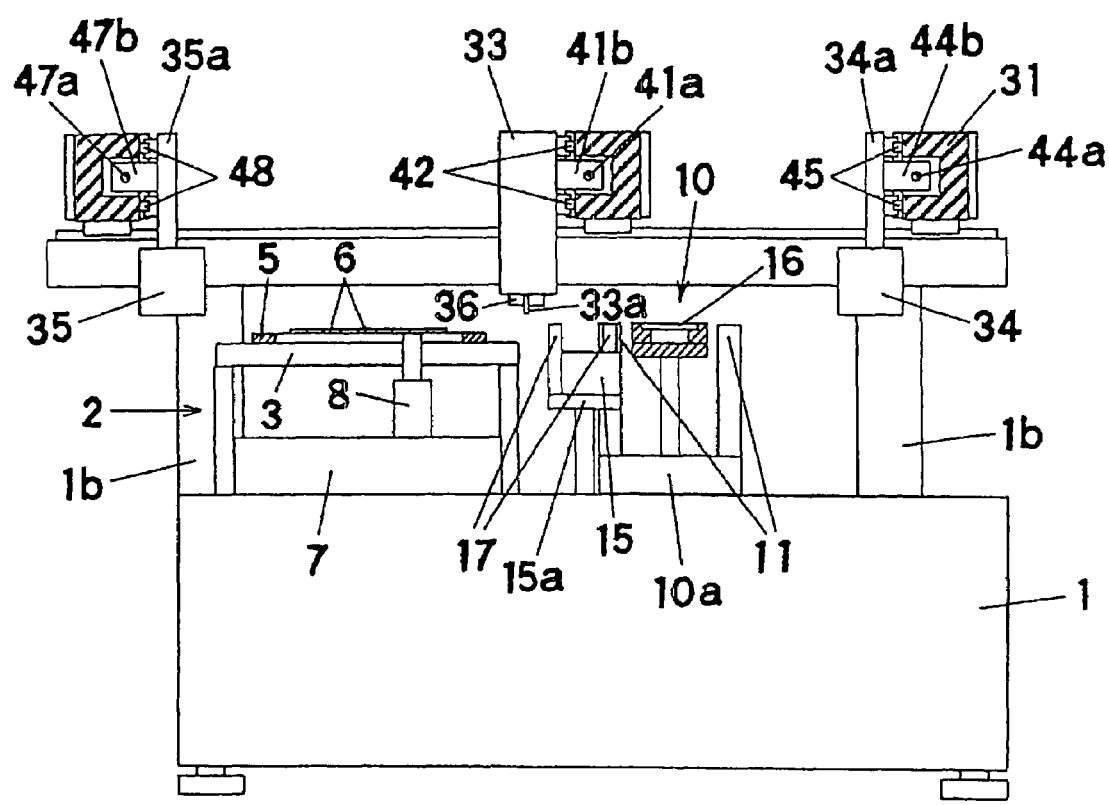
FIG. 3 is a side sectional view of the electronic component mounting apparatus according to the embodiment of the invention.

FIG. 2 omits illustration of the center beam member 30 in FIG. 1 and a third camera 15 is arranged between the component supply portion 2 and the board holding portion 10. The third camera 15 is a line camera having a line sensor and by moving the mounting head 33 which has picked up the chip 6 at the component supply portion 2 in X direction on an upper side of the third camera 15, the third camera 15 takes an image of the chip 6 held by the mounting head 33. The third camera 15 constitutes a component imaging camera for taking an image of the chip 6 held by the mounting head 33 from a lower side.

As shown by FIG. 1, FIG. 3, the mounting head 33 is provided with a fourth camera 36 by directing an image taking direction thereof to a lower side. The fourth camera 36 is moved integrally with the mounting head 33 by a mounting head moving mechanism and can take images of the component supply portion 2, a vicinity of the third camera 15 and the board holding portion 10 disposed in a moving range thereof. As mentioned later, the fourth camera 36 is used as a calibrating camera for processing to calibrate a coordinates system. The mounting head 33 is arranged to move between the first camera 34 constituting the board imaging camera and the second camera 35 constituting the supply portion imaging camera in view of a mechanism thereof and the fourth camera 36 moved integrally with the mounting head 33 can cover both image taking ranges of the first camera 34, and the second camera 35.

Here, an explanation will be given of a coordinates system of the electronic component mounting apparatus having the above-described constitution and a reference mark for processing to calibrate a coordinates system. As described above, the electronic component mounting apparatus is provided with three independent XY linear moving machines of the mounting head moving mechanism, the first camera moving mechanism and the second camera moving mechanism, and individual XY coordinates systems are present at the respective moving mechanisms. An XY coordinates system of the first camera moving mechanism (first camera coordinates system) signifies a coordinates system when the first camera 34 is moved within a moving range including at least the upper side of the board holding portion 10, similarly, an XY coordinates system of the second camera moving mechanism (second camera coordinates system) signifies a coordinate system when the second camera 35 is moved within a moving range including at least the upper side of the component supply portion 2.

Here, an explanation will be given here of a zone classified coordinates system set to the XY coordinates system of the mounting head moving mechanism. The mounting head moving mechanism is provided with the function of moving the mounting head 33 within a moving range including from the component supply portion 2 to the board holding portion 10 and a common single XY coordinates system is present in the moving range. Although normally, in the case of instructing a moving target position of the mounting head 33, all the moving target positions are instructed by a coordinates value of the common XY coordinates system, according to the embodiment, the XY coordinates system is dealt with by being divided into three independent coordinates system in accordance with the moving range of the mounting head 33 for convenience.

That is, the coordinates system of the mounting head moving mechanism is divided into three zones of the component supply portion 2, the vicinity of the third camera 15 for taking an image of the component and the board holding portion 10, and the respectives thereof are dealt with as individual coordinates systems of a component supply portion coordinates system, a component image taking coordinates system and a board coordinates system. In other words, according to the embodiment, in the electronic component mounting apparatus inherently having three independent XY coordinates systems, the operation is controlled by regarding that five independent XY coordinates systems (first camera coordinates system, second camera coordinates system, component supply portion coordinates system, component image taking coordinates system and board coordinates system) are present.

Next, an explanation will be given of reference marks for processing to calibrate coordinates systems provided at the above-described three zones. The respective reference marks are used in the case of excluding mechanism errors in the respective zones and also used in the case of relating the coordinates systems of the respective zones to each other, first, an explanation will be given of a supply portion reference mark provided at zone 1 including the first supply portion 2 in reference to FIGS. 5A and 5B. As shown by FIG. 5A, the recognizing marks A1, B1 as supply portion reference marks are formed at the upper faces of the mark posts 18 provided at the fixed positions of the wafer holding table 3.

Figure 5B:
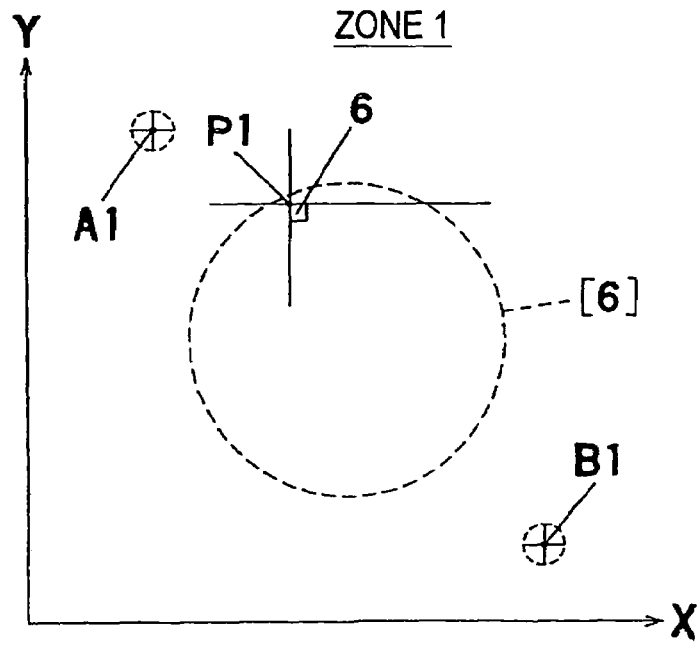

As shown by FIG. 5B, in the coordinates system including zone 1, the recognizing marks A1, B1 are disposed at positions fixed with positions relative to a reference position of the semiconductor wafer [6] aggregated with the chips 6 (for example, a pick up start point P1 in taking out the chip 6). After attaching the mark posts 18, by taking the recognizing marks A1, B1 by the supply portion reference mark imaging camera (second camera 35, fourth camera 36) to recognize the images and storing the provided positions of the recognizing marks A1, B1, the recognizing marks A1, B1 are related to the reference position of the electronic component in the component supply portion 2. The reference position of the electronic component is not limited to the pick up start point P1 but may be a line or a point capable of specifying the position of the component in the component supply portion 2.

By recognizing an image taking result of taking the images of the recognizing marks A1, B1 by the second camera 35 as the supply portion reference mark imaging camera as the images, the coordinates system when the second camera 35 is moved by the second camera moving mechanism for taking the image of the chip in the component supply portion 2, that is, the second camera coordinates system is processed to calibrate. Further, by recognizing an image taking result of taking the images of the recognizing marks A1, B1 by the fourth camera 36 constituting the calibrating camera as the supply portion reference mark imaging camera as the images, the coordinates system when the mounting head 33 is moved by the mounting head moving mechanism for picking up the chip 6 of the first supply portion 2, that is, the first supply portion coordinates system is processed to calibrate.

Figure 6A:
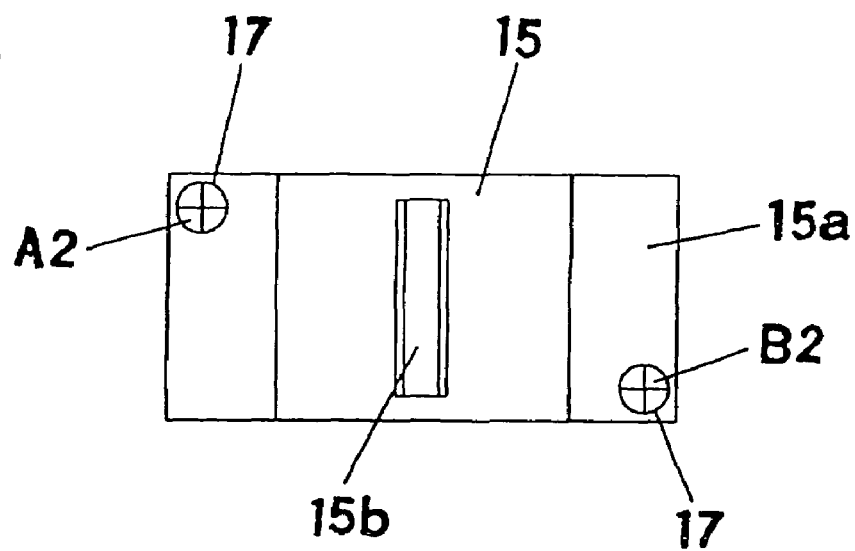
FIGS. 6A and 6B illustrate explanatory views of a component imaging camera reference mark of the electronic component mounting apparatus according to the embodiment of the invention.

Next, an explanation will be given of a component imaging camera reference mark provided at zone 2 including the vicinity of the third camera 15. As shown by FIG. 6A, two mark posts 17 are erected at diagonal positions interposing a light receiving portion 15b of the line sensor provided to the third camera 15 therebetween on an upper face of a camera mounting base 15a (also refer to FIG. 3) provided at a fixed position on the base 1. Recognizing marks A2, B2 as component imaging camera reference marks are formed at upper faces of the mark posts 17.

Figure 6B:
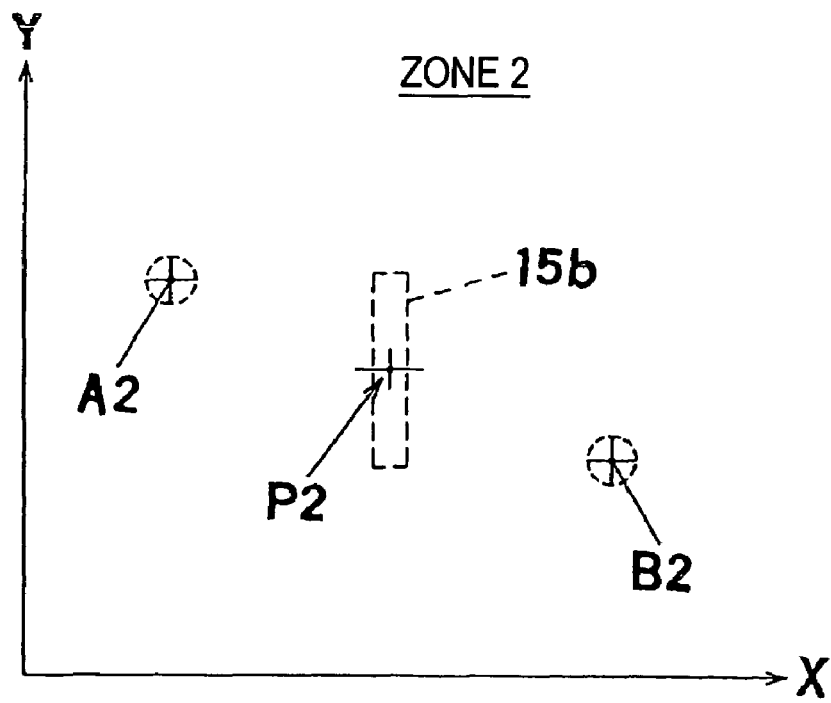

As shown by FIG. 6B, the recognizing marks A2, B2 are disposed at positions fixed with positions relative to a reference position (for example, center position P2 of the light receiving portion 15b) of the third camera 15 in the coordinates system including zone 2. After fixing the positions of the mark posts 17, by taking the images of the recognizing marks A2, B2 by the fourth camera 36 constituting the calibrating camera to recognize as the images and storing the provided positions of the recognizing marks A2, B2, the recognizing marks A2, B2 are related to a reference position of the optical coordinates system of the third camera. The reference position of the optical coordinates system is not limited to the center position P2 but may be a line or a point capable of specifying a position in a field of view of taking an image of the third camera 15.

The images of the recognizing marks A2, B2 can be taken by disposing the fourth camera 36 at the vicinity in a side direction of the third camera 15 by moving the mounting head 33, and the fourth camera 36 constitutes a calibrating camera capable of taking the image of the component imaging camera reference mark by integrally moving with the mounting head 33 by the mounting head moving mechanism. By recognizing an image taking result as the image, the coordinates system when the mounting head 33 holding the chip 6 is moved on the upper side of the third camera 15 for taking the image of the component, that is, the component image taking coordinates system is processed to calibrate.

Figure 7A:
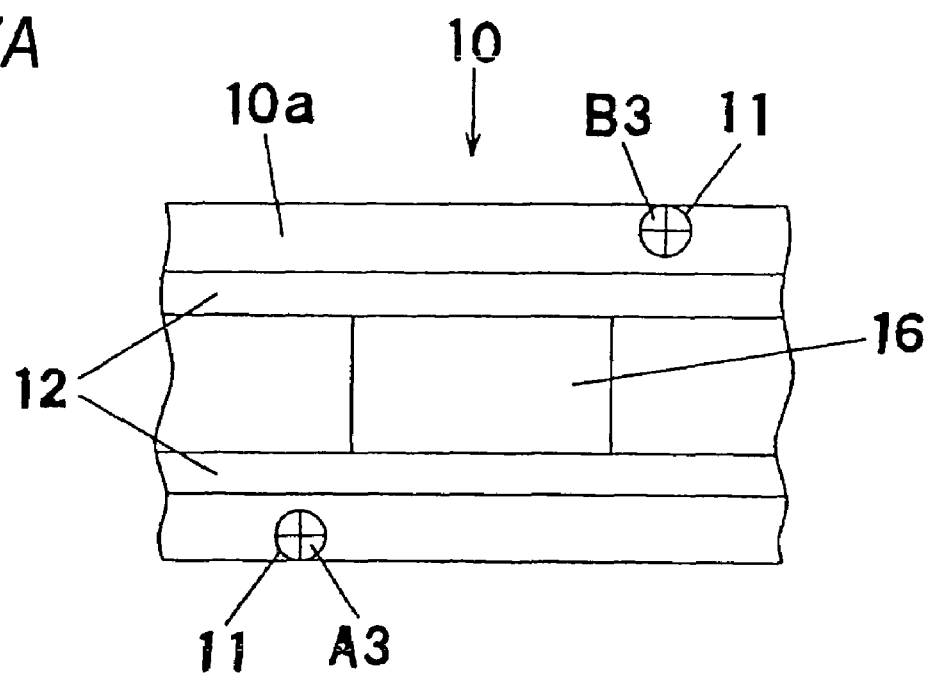
FIGS. 7A and 7B illustrate explanatory views of a board holding portion reference mark of the electronic component mounting apparatus according to the embodiment of the invention.

Next, an explanation will be given of a board holding portion reference mark provided at zone 3 including the board holding portion 10. As shown by FIG. 7A, two mark posts 11 are erected at diagonal positions interposing the board 16 positioned to the board carrying portions 12 therebetween on an upper face of a board holding portion mounting base 10a provided at a fixed position on an upper side of the base 1. Recognizing marks A3, B3 as board holding portion reference marks are formed at upper faces of the mark posts 11.

Figure 7B:
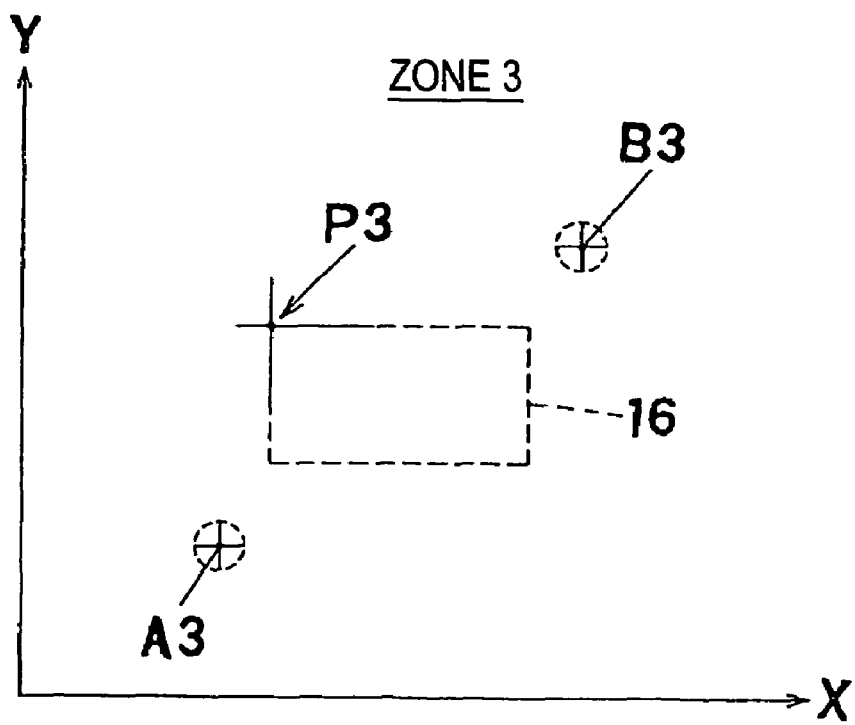

As shown by FIG. 7B, in the coordinates system including zone 3, the recognizing marks A3, B3 are disposed at positions fixed with a relative position relationship with a reference position (for example, corner point P3 of the board 16 positioned at the board carrying portion 12) of the board 16. After attaching the mark posts 11, by taking the images of the recognizing marks A3, B3 by a board holding portion imaging camera (fourth camera 36, first camera 34) to recognize as the images and storing the provided positions of the recognizing marks A3, B3, the recognizing marks A3, B3 are related to the reference position of the board 16 held and positioned by the board holding portion 10. The reference position of the board 16 is not limited to the corner point P3 but may be a line or a point related to the component mounting position of the board.

By recognizing an image taking result of taking the image of the recognizing marks A3, B3 by the first camera 34 as the board holding portion reference mark imaging camera as the images, the coordinates system when the first camera 34 is moved by the first camera moving mechanism for taking the images of the board at the board holding portion 10, that is, the first camera coordinates system is processed to calibrate. Further, by recognizing the image taking result of taking the images of the recognizing marks A3, B3 by the fourth camera 36 constituting the calibrating camera as the supply portion reference mark imaging camera as the images, the coordinates system when the mounting head 33 is moved by the mounting head moving mechanism for mounting the chip 6 to the board 16 held by the board holding portion 10, that is, the board coordinates system is processed to calibrate.

Further, by recognizing the common reference mark by the different cameras, the different coordinates systems can be related to each other. Further, by pertinently recognizing the reference marks respectively provided from zone 1 through zone 3 by the fourth camera 36 constituting the calibrating camera, an error in mechanism brought about when the moving range is significantly enlarged can also be excluded.

By providing the reference marks specifying relative position relationships with operational targets in the respective zones for the respective zones as described above, even when operational accuracies of the mounting head and the moving mechanisms of the cameras in making access to the respective zones are agingly varied owing to the thermal elongation or contraction or the like, by taking the images of the reference marks by the cameras moving by the moving mechanisms to refer at a predetermined timing of a procedure of continuously operating the electronic component mounting apparatus, accuracies of moving to the operational targets can always be ensured by a coordinates system calibrating processing, mentioned later.

In the above-described constitution, the fourth camera 36, constituting the exclusive calibrating camera integrally moved with the mounting head 33 by the mounting head moving mechanism, is used as the reference mark imaging camera capable of taking the images of the supply portion reference mark and the board holding portion reference mark. Further, in accordance with an object of the coordinates system calibrating processing, the first camera 34 constituting the board imaging camera is made to function as the reference mark imaging camera for taking the image of the board holding portion reference mark and the second camera 35 constituting the supply portion imaging camera is made to function as the reference mark imaging camera for taking the image of the supply portion reference mark.

Next, an explanation will be given of forming data for the coordinates system calibrating processing for correcting a positional error owing to thermal elongation or contraction of the like of the moving mechanisms in the above-described respective coordinates systems. In a procedure of repeatedly executing component mounting operation by the electronic component mounting apparatus having the above-described constitution, the mounting head 33, the first camera 34, and the second camera 35 are moved by the respective moving mechanisms at high frequencies and therefore, temperatures of respective portions of mechanisms constituting the moving mechanisms are elevated by heat generation of the drive motor or friction heat of sliding mechanisms, and by elevating the temperature, elements of the mechanisms of a ball screw and the like are thermally elongated or contracted. Further, accuracies of operating the moving mechanisms are agingly varied owing to the thermal elongation or contraction and highly accurate operation cannot be maintained stably.

Therefore, according to the embodiment, coordinates systems calibrating processing is executed for detecting states of the moving mechanisms for moving the mounting head 33, the first camera 34 and the second camera 35 and setting proper coordinates correcting data in accordance with a result of detection at respective times at predetermined intervals in operating the apparatus. The coordinates system calibrating processing is respectively executed for the above-described five independent XY coordinates systems (first camera coordinates system, second camera coordinates system, component supply portion coordinates system, component image taking coordinates system and board coordinates system).

Here, as described above, by executing the coordinates system calibrating processing individually in respective zones dividing the moving range of the coordinates system of the mounting head moving mechanism into three zones of the component supply portion, the vicinity of the third camera and the board holding portion with regard to the coordinates system of the mounting head moving mechanism, even in a constitution of moving the mounting head by the moving mechanism having a long moving stroke in Y direction as in the electronic component mounting apparatus shown in the embodiment, excellent calibration accuracy can be ensured.

That is, although when a ball screw having a long dimension is used in accordance with a moving stroke, a positioning error by accumulating thermal elongation or a contraction or local pitch error of the ball screw differs by the above-described zones, by forming data for calibrating processing by executing the coordinates system calibrating processing explained below for the respective zones, proper position correction can be executed in accordance with the respective zones.

Figure 9:
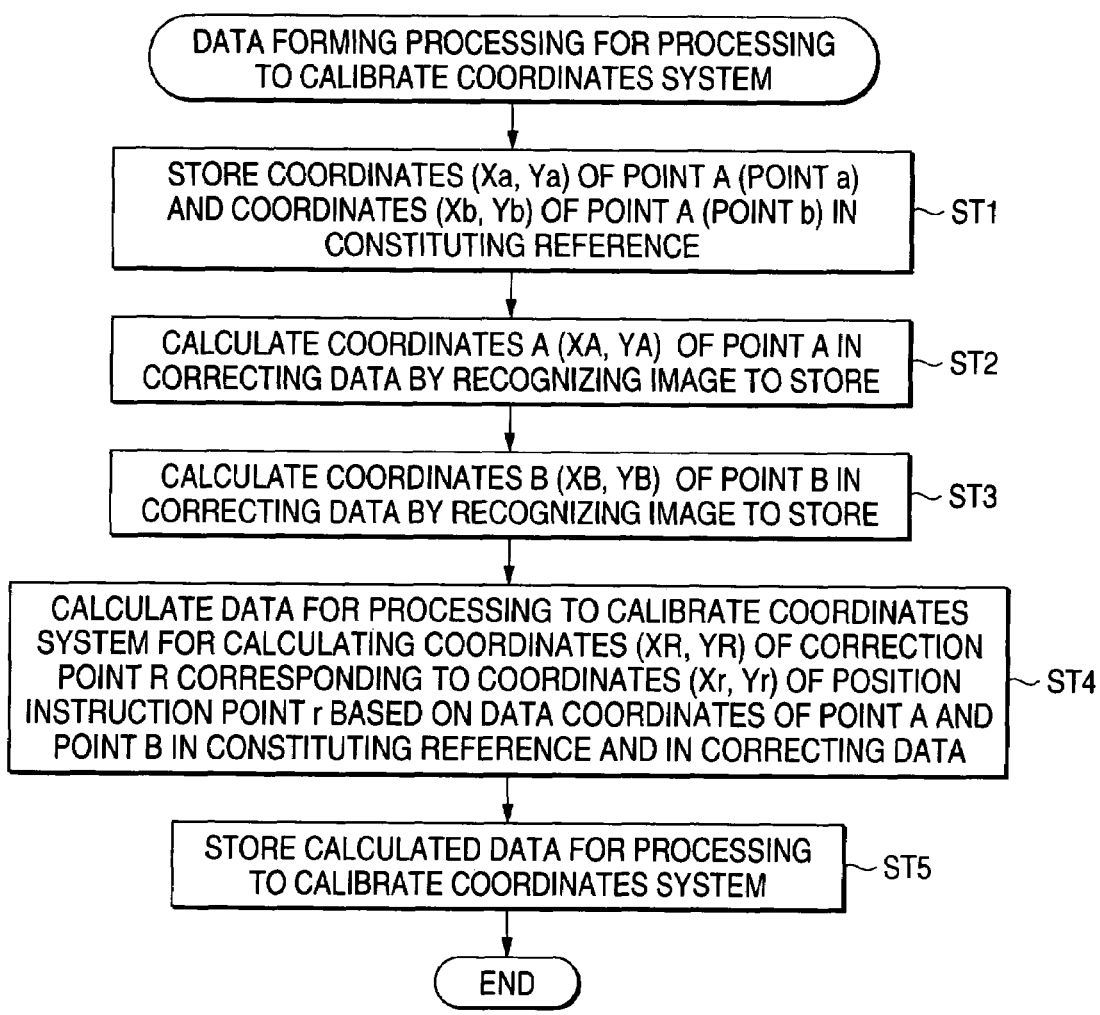
FIG. 9 is a flowchart of processings of forming data for processing to correct a coordinates system in an electronic component mounting method according to the embodiment of the invention.
Figure 10:
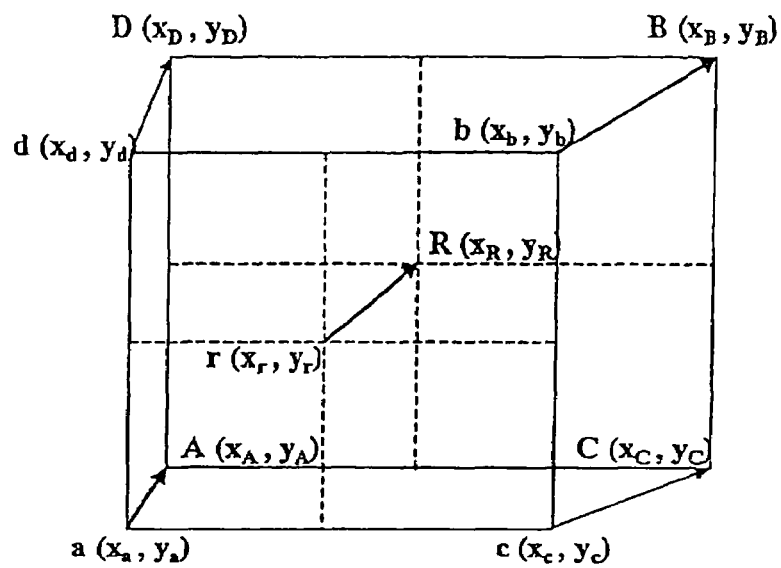
FIG. 10 is an explanatory view of the data for processing of to correct the coordinates system in the electronic component mounting method according to the embodiment of the invention.

Next, an explanation will be given of a processing of forming data for the coordinates system calibrating processing in reference to FIG. 9, FIG. 10. Point A shown in FIG. 10 represents A1, A2, A3 respectively shown in FIGS. 5A and 5B, FIGS. 6A and 6B, FIGS. 7A and 7B and point B represents B1, B2, B3, respectively. First, in FIG. 9, coordinates (Xa, Ya), (Xb, Yb) of point a, point b respectively showing point A, point B in constituting the reference are stored (ST1). That is, in finishing to integrate the apparatus or in finishing maintenance operation, images of point A, point B constituting reference marks in the respective zones are taken by the zone reference mark imaging cameras and coordinates positions of point A, point B are calculated by recognizing the images to store to a data storing portion 53.

Further, in operating the apparatus, when a timing at which the coordinates system calculating processing is to be executed is reached, the following is executed. First, coordinates A (XA, YA) of point A in correcting data are calculated by recognizing the images to store (ST2) and coordinates B (XB, YB) of point B in correcting data are calculated by recognizing the images to store (ST2). That is, the images of point A, point B constituting the reference marks in the respective zones are taken by the reference mark imaging cameras in correspondence with the zones and the coordinates positions of point A, point B are calculated by recognizing the images to store to the data storing portion 53.

Next, based on data of the coordinates of point A and point B in constituting the references and correcting data, data for the coordinates system calibrating processing is calculated for calculating coordinates (XR, YR) of corrected point R in correspondence with coordinates (Xr, Yr) of a position instructing point r (ST4). Further, the calculated data for the coordinates system calibrating processing is stored to the data storing portion 53 (ST5).

Data for the coordinates system calibrating processing will be explained. When the images of point A, point B are taken in correcting data at (ST2), in the case in which the moving mechanism for moving the reference mark imaging camera is elongated or contracted by influence of heat or the like, even when the same control instruction is outputted to the reference mark imaging camera, the image of the reference mark is taken in a state in which the reference mark imaging camera is moved to a position shifted by an amount of elongation or contraction relative to that in constituting the reference. Since point A, point B are reference points provided at fixed points which are not influenced by elongation or contraction of the mechanism element constituting the moving mechanism as references of positions in the respective zones to which the component supply portion 2, the vicinity of the third camera 15 and the board holding portion 10 belong, as shown by FIG. 10, generally, point A, point B do not coincide with point a, point b and are detected at positions shifted by the amount of elongation or contraction of the moving mechanism.

Therefore, displacements between point A and point a and point B and point b show aging variations of positioning accuracies of the moving mechanisms by continuously operating the electronic component mounting apparatus. That is, when the object of moving by the moving mechanism is the mounting head 33, the variation in the positioning accuracy emerges as a positioning error in taking out the chip 6 by the mounting head 33 or mounting the held chip 6 to the board 15. Further, when the object of moving by the moving mechanism is the camera, the image is taken in a state in which the camera per se is positionally shifted from a position to which the camera is to move inherently and a result of recognizing the position provided by taking the image includes an error of an amount of the positional shift.

In order to calibrate the positioning error by the aging variation, according to the embodiment, the above-described positioning error is corrected in forming data for the coordinates system calibrating processing and therefore, coordinates conversion equation (1), (2) shown in FIG. 10 are calculated, and in driving the mounting head moving mechanism or the camera moving mechanism in mounting operation, by using the coordinates conversion equations (1), (2), the coordinates values given as the position instruction point on the mounting data are corrected. That is, when the position instruction point r constituting the moving target position in operation is instructed by the coordinates (Xr, Yr), the moving mechanism is driven by constituting the target position by a correction point R given by the coordinates (XR, YR) converted by the coordinates conversion equations (1), (2). Thereby, moving operation excluding the positioning error by elongation or contraction of the moving mechanism as little as possible is realized.

Further, in deriving the coordinates conversion equations shown in FIG. 10, the following approximation or simplification is adopted. That is, here, the coordinates conversion equations are formed based on an assumption that elongation or contraction of the mechanism element by thermal influence or the like is produced in parallel with axes both in an X axis direction and a Y axis direction and a quadrangle abcd in constituting the reference is changed to a quadrangle ABCD by thermal elongation or contraction without producing displacements in angular directions. Further, the data for the coordinates calibrating processing formed in this way is used for correcting data of target positions in operating the moving mechanisms in the respective coordinates systems.

Further, in the above-described constitution, zone 1 is duplicated with the second camera coordinates system and the component supply portion coordinates system, and the images of the supply portion reference marks provided at zone 1 can be taken by either of the second camera 35 constituting the supply portion imaging camera and the fourth camera 36 constituting the calibrating camera. When a tendency of aging elongation or contraction of the second camera moving mechanism is similar to a tendency of aging elongation or contraction of the mounting head moving mechanism in the component supply portion coordinates system, the coordinates system calibrating processing of both of the second camera coordinates system and the component supply portion coordinates system may be executed based on the image taking result of taking the image of the supply portion reference marks by either of the cameras.

Further, even with regard to the first camera coordinates system and the board coordinates system in zone 3, the images of the reference marks of the board holding portion can be taken by either of the first camera 35 constituting the board holding portion imaging camera and the fourth camera 36 constituting the calibrating camera, and similarly, when a tendency of aging elongation or contraction of the first camera moving mechanism is similar to a tendency of aging elongation or contraction of the mounting head moving mechanism in the board coordinates system, the coordinates system calibrating processing of both of the first camera coordinates system and the board coordinates system may be executed based on the image taking result of taking the images of the board holding portion reference marks by either of the cameras.

Figure 8:
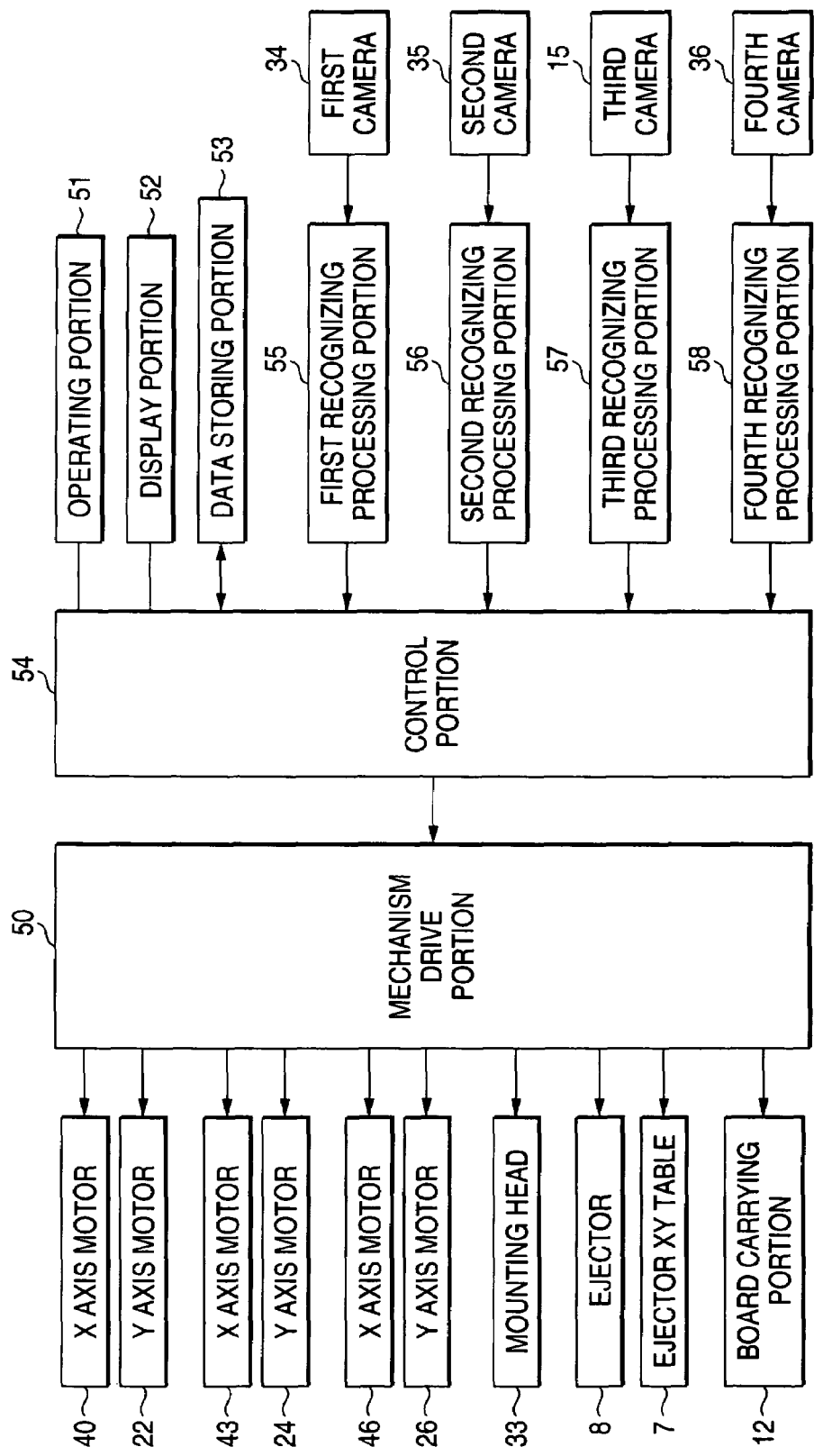
FIG. 8 is a block diagram showing a constitution of a control system of the electronic component mounting apparatus according to the embodiment of the invention.

Next, a constitution of a control system of the electronic component mounting apparatus will be explained in reference to FIG. 8. In FIG. 8, a mechanism drive portion 50 comprises motor drivers for electrically driving motors of the respective mechanisms shown below and control apparatus for controlling air pressure supplied to the cylinders of respective mechanisms and the following respective drive elements are driven by controlling the mechanism drive portion 50 by a control portion 54.

The X axis motor 40 and the Y axis motor 22 drive the mounting head moving mechanism for moving the mounting head 33. The X axis motor 43, the Y axis motor 24 drive the first camera moving mechanism for moving the first camera 34 and the X axis motor 46, the Y axis motor 26 drive the second camera moving mechanism for moving the second camera 35, respectively. Further, the mechanism drive portion drives the moving up and down mechanism of the mounting head 33, and a component sucking mechanism by a nozzle 33a (refer to FIG. 2), and drives the moving up and down cylinder of the ejector 8 as well as drive motors of the ejector XY table 7 and the board carrying portion 12.

The data storing portion 53 stores various data of mounting data or a component data. An operating portion 51 is an input apparatus of a keyboard or a mouse and inputs data or control command. A display portion 52 displays an image taking screen by the first camera 34, the second camera 35, the third camera 15, the fourth camera 36 and displays a guide screen in inputting by the operating portion 51.

A first recognition processing portion 55 processes to recognize the image taken by the first camera 34. That is, the first recognition processing portion 55 calculates a position of a component mounting position 16a (refer to FIG. 13) at which the chip 6 is mounted at the board 16 held by the board holding portion 10 by recognizing the image of taking the image of the board 16 and calculates positions of the recognizing marks A3, B3 shown in FIGS. 7A and 7B by recognizing the image of taking the image of the mark posts 11.

A second recognition processing portion 56 processes to recognize the image taken by the second camera 35. That is, the second recognition processing portion 56 calculates the position of the chip 6 at the component supply portion 2 by recognizing the image of taking the image of the semiconductor wafer [6] (refer to FIGS. 5A and 5B) and calculates the positions of the recognizing marks A1, B1 shown in FIGS. 5A and 5B by recognizing the image of taking the image of the mark posts 18. A third recognition processing portion 57 processes to recognize the image taken by the third camera 15. That is, the third recognition processing portion 57 calculates the position of the chip 6 by recognizing the image of taking the image of the chip 6 held in the mounting head 33.

A fourth recognition processing portion 58 processes to recognize the image taken by the fourth camera 36. That is, the fourth recognition processing portion 58 calculates the positions of the recognizing marks A1, B1 by processing to recognize the image taken by the fourth camera 36 moving to the component supply portion 2 along with the mounting head 33. Further, the fourth recognition processing portion 58 calculates the positions of the recognizing marks A2, B2 by processing to recognize the image taken by the fourth camera 36 moving to the upper side of the third camera 15 and calculates the coordinates of the positions of the recognizing marks A3, B3 by processing to recognize the image taken by the fourth camera 36 moving to the board holding portion 10.

Results of recognition by the first recognition processing portion 55, the second recognition processing portion 56, the third recognition processing portion 57, the fourth recognition processing portion 58 are transmitted to the control portion 54. Further, the control portion 54 forms data for the coordinates system calibrating processing shown in FIG. 10 based on the results of recognizing the images. The formed data for processing to calibrate the coordinates system is stored to the storing portion 53. Further, the control portion 54 functions as control means for executing a control processing, explained below, by controlling the mechanism drive portion 50 shown in FIG. 8 based on the above-described results of recognizing the images and the data for processing to calibrate the coordinates systems stored to the storing portion 53.

First, the control portion 54 controls the component mounting mechanism comprising the mounting head 33 and the mounting head moving mechanism based on a result of taking the image of the component supply portion 2 by the second camera 34 constituting the supply portion imaging camera. Thereby, the chip 6 can be taken out from the component supply portion 2 by the mounting head 33. Further, prior to taking the image of the component supply portion 2 by the second camera 34, the second camera 35 is moved by controlling the supply portion imaging camera moving means based on a result of taking the image of the supply portion reference mark by the second camera 35 constituting the supply portion reference mark imaging camera.

Further, the control portion 54 moves the mounting head 33 to the third camera 15 constituting the component imaging camera by controlling the mounting head moving mechanism based on a result of taking the image of the component imaging camera reference mark by the fourth camera 36 constituting the calibrating camera, that is, by adding the data for the coordinates system calibrating processing of the component image taking coordinates system formed based on the image taking result. Further, the control portion 54 mounts the chip 6 to the component mounting position of the board 16 based on the image taking result by the third camera.

Further, the control portion 54 takes out the chip 6 from the component supply portion 2 by the mounting head 33 by controlling the mounting head moving mechanism based on a result of taking the image of the supply portion reference mark by the reference mark imaging camera, that is, by adding the data for the coordinates system calibrating processing of the component supply portion coordinates system formed based on the image taking result. Further, the control portion 54 mounts the chip 6 held at the mounting head 33 to the component mounting position 16*a* of the board 16 by controlling the mounting head moving mechanism based on a result of taking the image of the board holding portion reference mark by the reference mark imaging camera, that is, by adding the data for the coordinates system calibrating processing of the board coordinates system board based on the image taking result.

Figure 11:
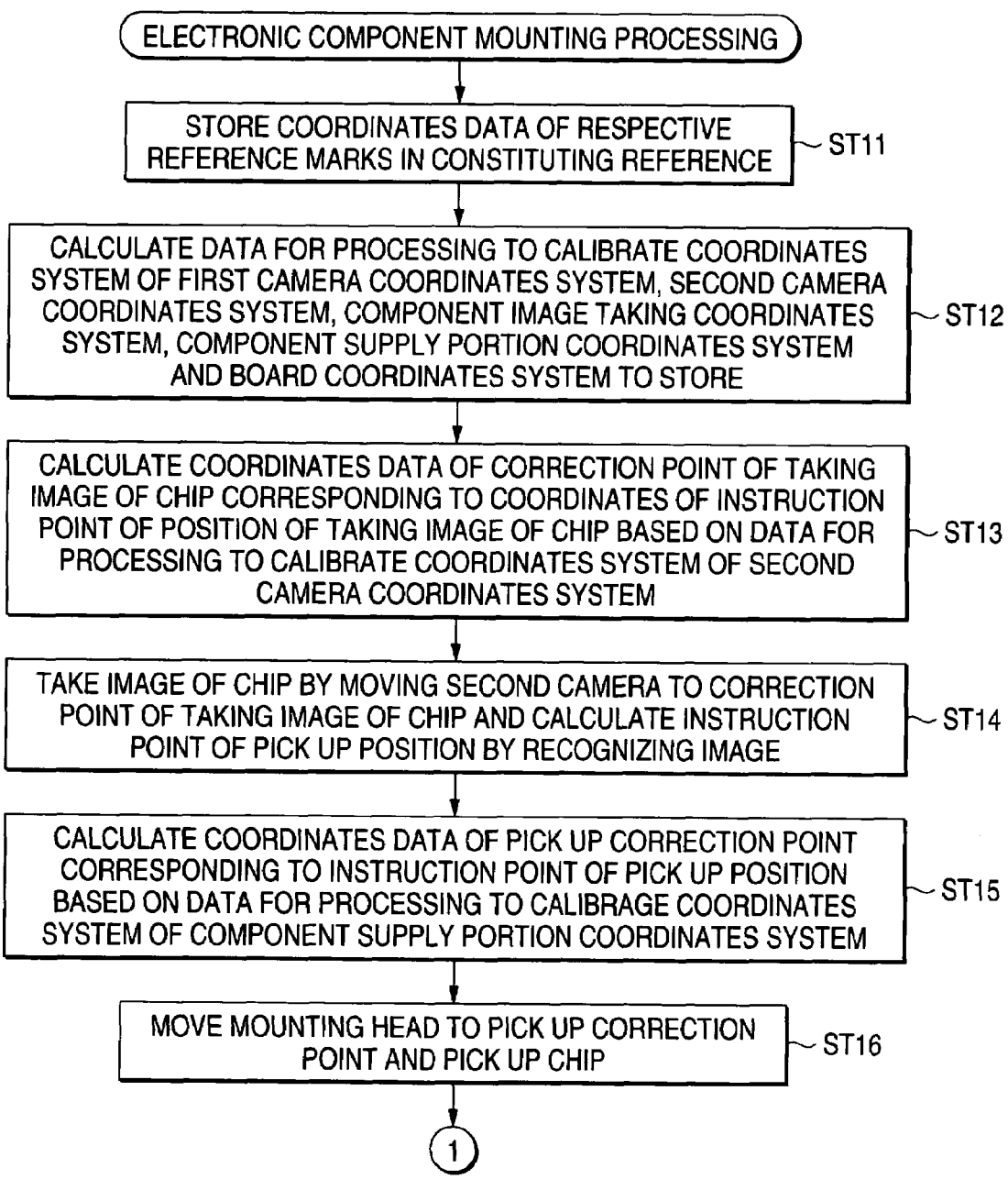
FIG. 11 and FIG. 12 illustrat a flowchart of processings of mounting an electronic component according to the embodiment of the invention.
Figure 12:
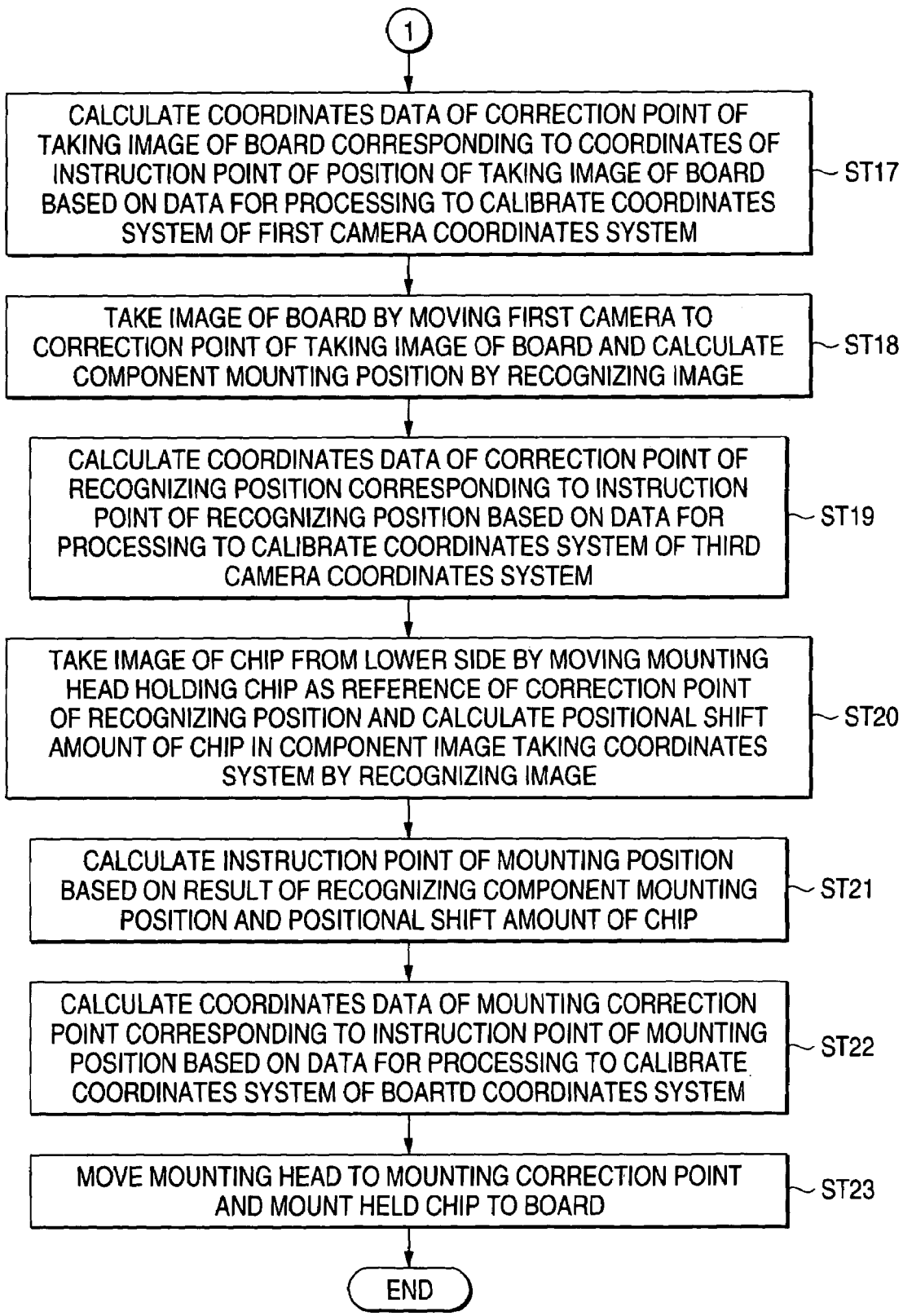

The electronic component mounting apparatus is constituted as described above, and an explanation will be given of an electronic component mounting method in reference to FIG. 11, FIG. 12, FIGS. 13A and 13B, FIGS. 14A and 14B as follows. FIG. 11, FIG. 12 dividedly describe a series of processing steps of the electronic component mounting method. According to the electronic component mounting method, as shown by FIGS. 13A and 13B, the chip 6 is taken out from the component supply portion 2 by the mounting head 33 and is mounted to the board 16 held at the board holding portion 10.

In FIG. 11, first, the coordinates data of the respective reference marks in constituting the reference is stored (ST11). As described above, the processing is executed in finishing assembling the apparatus or in finishing maintenance operation. Next, at a predetermined timing of a procedure of continuing to operate the apparatus, the data for the coordinates systems calibrating processing of the first camera coordinates system, the second camera coordinates system, the component image taking coordinates system, the component supply portion coordinates system and the board coordinates system is calculated and stored to the data storing portion 53 (ST12). That is, in (ST11), (ST12), the processing of forming the data for the coordinates system calibrating processing shown in FIG. 9, FIG. 10 is executed for the above-described respective coordinates systems by recognizing the reference marks shown in FIGS. 5A and 5B, FIGS. 6A and 6B, FIGS. 7A and 7B.

Thereafter, operation of taking out the chip 6 from the component supply portion 2 to mount to the board 16 is executed. First, for detecting the position of the chip 6 constituting the taking out object, the image of the chip 6 is started to be taken by the second camera 35, and the instruction point of the position of taking the image of the chip constituting the target position for moving the second camera 35 is instructed. At this occasion, the coordinates data of the correction point of the image of taking the chip in correspondence with the coordinates system of the instruction point of the position of taking the image of the chip is calculated based on the data for the coordinates system calibrating processing of the second camera coordinates system already formed at (ST12) (ST13). Further, the instruction point of the position of picking up the chip is calculated by recognizing the image by taking the image of the chip 6 by moving the second camera 35 to the correction point of taking the image of the chip (ST14).

Figure 13A:
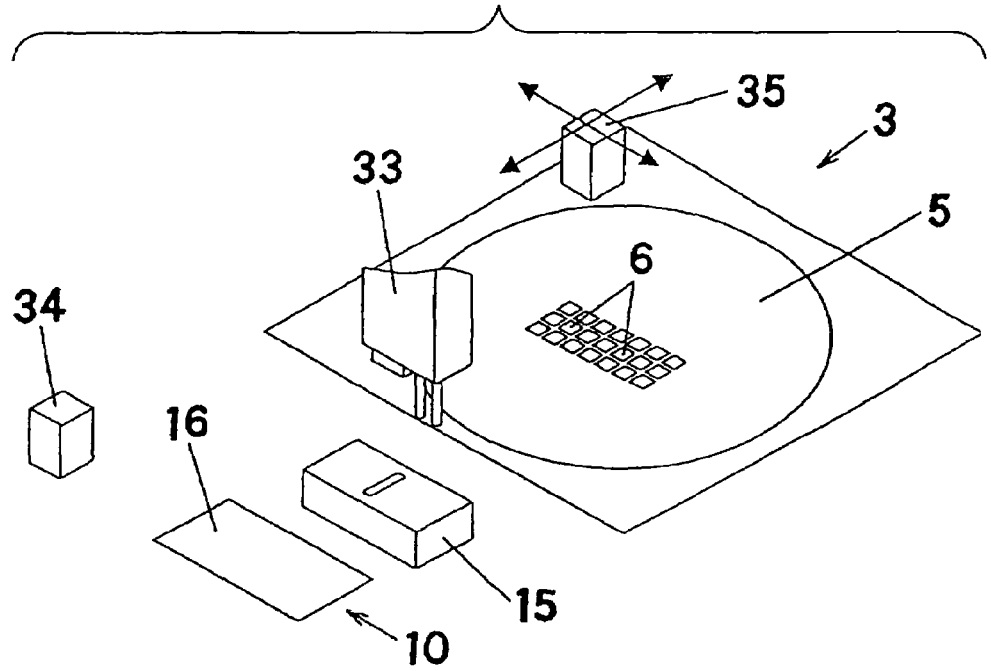
FIGS. 13A, 13B, 14A and 14B are explanatory views of steps of the method of mounting the electronic component according to the embodiment of the invention.
Figure 13B:
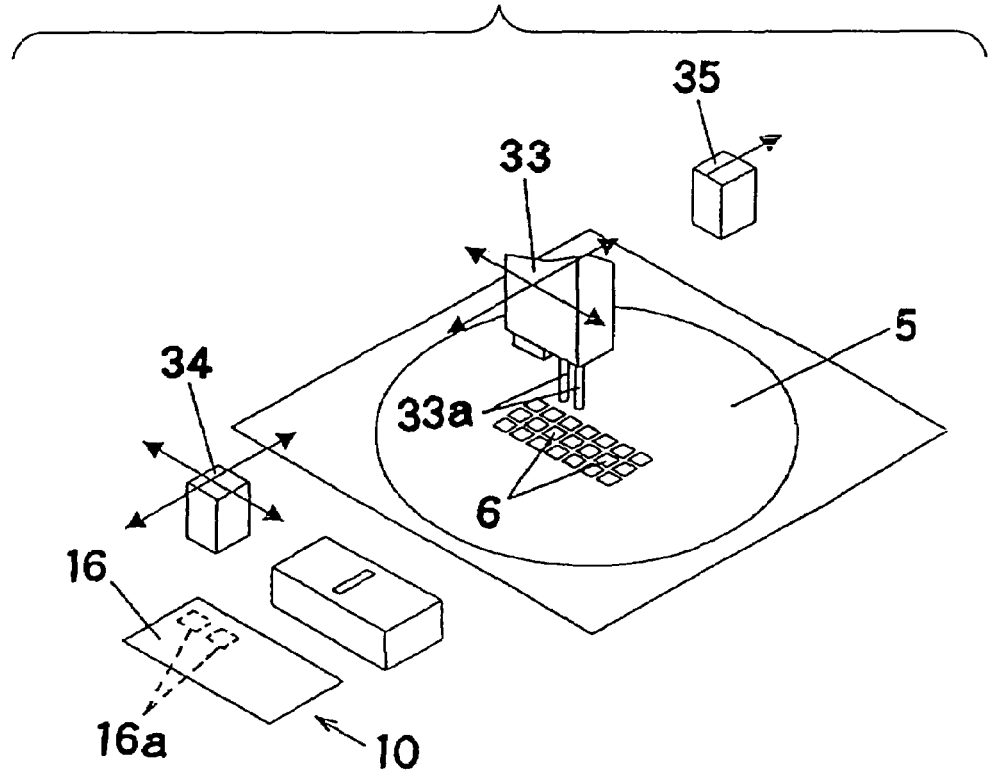

That is, as shown by FIG. 13A, the second camera 35 is moved to the correction point of taking the image of the chip on the upper side of the component supply portion 2 by the second camera moving mechanism, the images of a plurality (two pieces) of the chip 6 intended to pick up are taken by the second camera 35, and the positions of the plurality of chip 6 by processing to recognize the taken image by the second recognition processing portion 56, that is, the instruction point of the position of picking up the chip is calculated. At this occasion, since the positioning error by thermal elongation or contraction of the second camera moving mechanism has been corrected, the accuracy of recognizing the position can be ensured by moving the second camera 35 to the correct image taking position.

Thereafter, as shown by FIG. 13B, the second camera 35 is escaped from the upper side of the chip 6. Next, the coordinates data of the correction point of picking up the chip in correspondence with the coordinates of the instruction points of the position of picking up the chip calculated at (ST14) is calculated based on the result of recognizing the chip 6 by the second camera 35 and the data for the coordinates system calibrating processing of the component supply portion coordinates system (ST15). Further, as shown by FIG. 3B, the mounting head 33 is moved to the correction point of picking up the chip and the two chips 6 are successively picked up (ST16). At this occasion, since the positioning error by thermal elongation or contraction of the mounting head moving mechanism has been corrected, stable operation reducing a failure in picking up the chip is realized by correctly positioning the nozzle 33*a* to the chip 6.

In parallel with the picking up operation, board recognizing operation is executed. First, based on the data for the coordinates system calibrating processing of the first camera coordinates system calculated at (ST12), the correction point of taking the image of the board in correspondence with the coordinates of the instruction point of the position of taking the image of the board instructed by mounted data is calculated (ST17). Further, the component mounting position is calculated by recognizing the image by taking the image of the board by moving the first camera 34 to the correction point of taking the image of the board by the first camera moving mechanism (ST18).

That is, as shown by FIG. 13B, by successively moving the first camera 34 by constituting the object of taking the image by the two component mounting position 16*a* on the left side in the component mounting positions set at the board 16 by moving above the board 16 held by the board holding portion 10, the image is taken by taking the images of the component mounting positions 16*a* and thereafter, the first camera 34 is escaped from the upper side of the board 16. Further, by processing the image taken by the first camera 34 by the first recognition processing portion 55, the positions of the component mounting positions 16*a* of the board 16 are calculated.

Figure 14A:
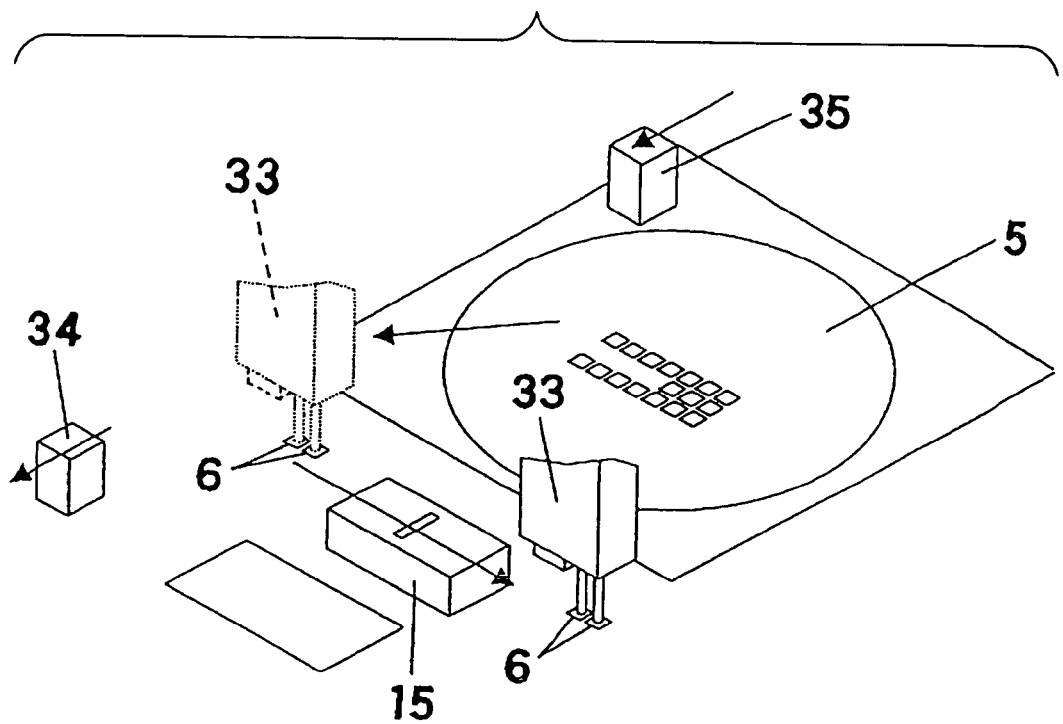

Next, the component is recognized by the third camera 15. First, based on the data for the coordinates system calibrating processing of the third camera coordinates system already formed at (ST12), the coordinates data of the correction point of the recognizing position in correspondence with the coordinates of the instruction point of the recognized position is calculated (ST19). Next, as shown by FIG. 14A, the image of the chip 6 is taken from the lower side by moving the mounting head 33 holding the chip 6 by constituting the reference by the correction point of the recognizing position, a position shift amount of the chip 6 in the component image taking coordinates system is calculated by recognizing the image (ST20). At this occasion, since the positioning error by elongating or contracting the mounting head moving mechanism has been corrected, the correct image can be acquired by correctly positioning the nozzle 33a to the light receiving portion 15b of the third camera 15 and the accurate position shift amount of the chip 6 can be calculated.

Figure 14B:
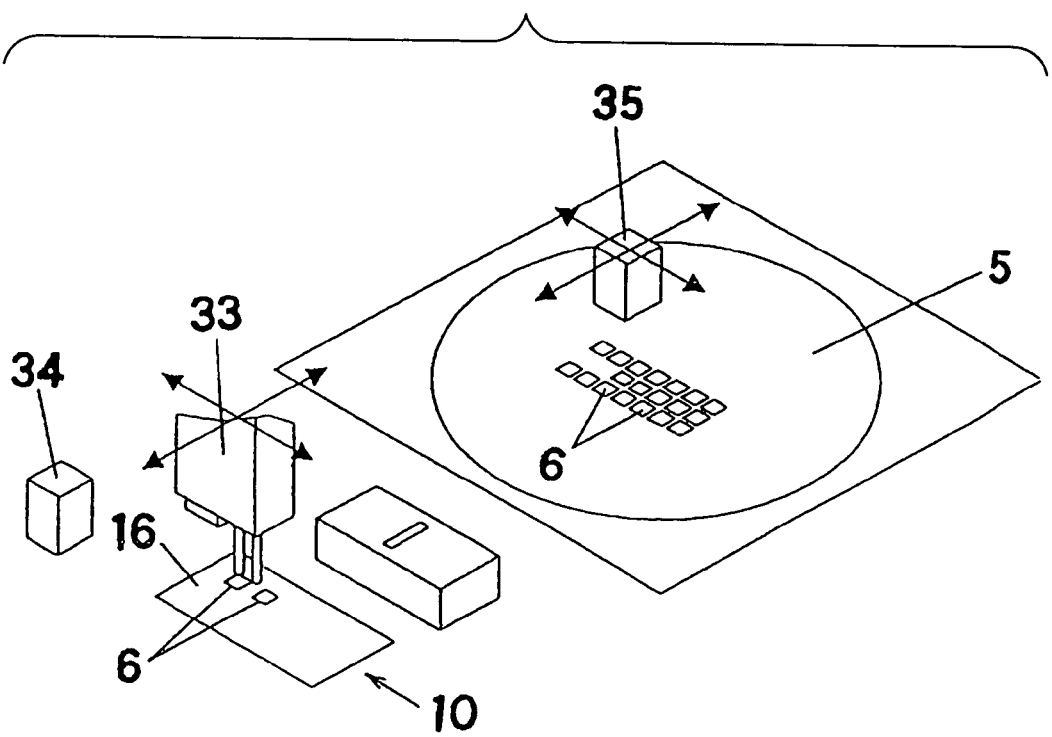

Next, based on the result of recognizing the position of the component mounting position and the position shift amount of the chip 6, the instruction point of mounting position is calculated (ST21). Next, the operation proceeds to mounting operation. First, based on the data of the coordinates system calibrating processing of the board coordinates system, the coordinates data of the correction point of mounting in correspondence with the coordinates of the instruction point of the mounting position is calculated (ST22). Next, as shown by FIG. 14B, the mounting head 33 is moved to the correction point of mounting the board 16 and the held chip 6 is mounted to the component mounting position 16a of the board 16 (ST23). Further, in mounting the chip 6 by the mounting head 33, the second camera 35 is moved to the upper side of the plurality of chips 6 to be successively picked up at the component supply portion 2 and the images of the plurality of chips 6 are taken by the second camera 35. Thereafter, respective steps similar to the above-described are repeatedly executed.

According to the above-described electronic component mounting operation, the component mounting mechanism is controlled based on the result of taking the image by the second camera 35 constituting the supply portion imaging camera and the supply portion imaging camera moving means is controlled based on the result of taking the image by the second camera 35 functioning as the camera for taking the image of the supply portion reference mark. Further, by moving the mounting head 33 holding the chip 6 to the third camera 15 constituting the component imaging camera by controlling the mounting head moving mechanism based on the result of taking the image by the fourth camera 36 constituting the calibrating camera and controlling the mounting head moving mechanism based on the result of taking the image by the third camera, the chip 6 held by the mounting head 33 is mounted to the component mounting position 16a of the board 16.

Further, the chip 6 is taken out from the component supply portion 2 by the mounting head 33 by controlling the mounting head moving mechanism based on the result of taking the image of the supply portion reference mark by the fourth camera 36 constituting the reference mark imaging camera, and controlling the mounting head moving mechanism based on the result of recognizing the board holding portion reference mark by the fourth camera 36, the chip 6 held by the mounting head 33 is mounted to the component mounting position 16a of the board 16.

As has been explained above, according to the electronic component mounting apparatus shown in the embodiment, with regard to the five coordinates systems of the first camera coordinates system, the second camera coordinates system, the component image taking coordinates system, the component supply portion image taking system and the board image taking system, in reference to the reference marks provided at the reference positions in the moving ranges by the respective coordinates systems, the coordinates system calibrating processing for correcting the aging variation of the positioning accuracy owing to elongation or contraction or twisting of the moving mechanism is executed.

Thereby, the position recognizing accuracy can be ensured by correctly maintaining the camera moving position in recognizing the chip at the component supply portion 2 and in recognizing the board at the board holding portion 10 by minimizing influence of the mechanism error by the aging variation of elongation or contraction or twisting of the camera moving mechanism. Further, the chip can be taken out from the component supply portion 2 with stable pick up accuracy by minimizing the influence of the mechanism error by the aging variation of elongation or contraction or twisting of the mounting head moving mechanism and the stable mounting operational accuracy can be constituted in recognizing the component by the third camera 15 or in mounting the chip at the board holding portion 10.

Further, although in the above-described embodiment, the coordinates system calibrating processing is executed for all of the above-described five coordinates systems, it is not necessarily needed to execute the coordinates system calibrating processing for all the coordinates systems. That is, it is determined whether to adopt the coordinates system calibrating processing by quantitatively calculating the positional shifts produced by the aging variation of the respective coordinates systems and in consideration of a degree of influencing the positional shift on the mounting quality and a load of a delay of cycle time by executing the coordinates system calibrating processing.

The present disclosure relates to subject matter contained in priority Japanese Patent Application No. 2004-91474 filed on Mar. 26, 2004, the content of which is herein expressly incorporated by reference in its entirety.

The electronic component and the electronic component mounting method of the invention achieve an effect of capable of ensuring the stable mounting operational accuracy by minimizing the influence of the mechanism error by the aging variation of elongation or contraction or twisting of the mounting head moving mechanism and are useful for a field of mounting an electronic component by an electronic component mounting apparatus of a constitution including a moving beam having a long moving stroke.

What is claimed is:

1. An electronic component mounting apparatus for mounting an electronic component supplied by a component supply portion to mount on a board, comprising:

the component supply portion which supplies the electronic component in a predetermined arrangement and is provided with a supply portion reference mark related to a reference position of the electronic component;

a board holding portion which holds the board;

a component mounting mechanism which mounts the electronic component taken out from the component supply portion by a take out head to the board held by the board holding portion by a mounting head;

a supply portion imaging camera which takes an image of the electronic component at the component supply portion;

a supply portion imaging camera moving means which horizontally moves the supply portion imaging camera relative to the component supply portion;

a supply portion reference mark imaging camera which takes an image of the supply portion reference mark; and a controller which controls the component mounting mechanism based on a result of the image taken by the supply portion imaging camera, and controls the supply portion imaging camera moving means based on a result of the image taken by the supply portion reference mark imaging camera;

wherein the electronic component is provided to the component supply portion in a state of being adhered on a sheet developed at a sheet holding member, and the component supply portion includes a base plate erected with a cylindrical member brought into contact with the sheet holding member from a lower side thereof and provided with the supply portion reference mark, a pressing plate arranged on an upper side of the cylindrical member for pressing the sheet holding member to a lower side, and moving up and down means for moving up and down the pressing plate, wherein the supply portion reference marks are provided at a plurality of portions across the cylindrical member.

2. The electronic component mounting apparatus according to claim 1, wherein the supply portion reference mark imaging camera is the supply portion imaging camera.

3. The electronic component mounting apparatus according to claim 1, wherein the supply portion reference mark imaging camera is a calibrating camera moved integrally with the mounting head.

4. The electronic component mounting apparatus according to claim 1, wherein a single component holding head serves also as the take out head and the mounting head.

5. An electronic component mounting method of mounting an electronic component supplied by a component supply portion to mount on a board, the method comprising the steps of: providing an electronic component mounting apparatus comprising the component supply portion which supplies the electronic component in a predetermined arrangement and provided with a supply portion reference mark related to a reference position of the electronic component, a board holding portion which holds the board, a component mounting mechanism which mounts the electronic component taken out from the component supply portion by a take out head to the board held by the board holding portion by a mounting head, a supply portion imaging camera which takes an image of the electronic component at the component supply portion, a supply portion imaging camera moving means which horizontally moves the supply portion imaging camera relative to the component supply portion, and a supply portion reference mark imaging camera which takes an image of the supply portion reference mark;

controlling the component mounting mechanism based on a result of the image taken by the supply portion imaging camera; and, controlling the supply portion imaging camera moving means based on a result of the image taken by the supply portion reference mark imaging camera, wherein the component supply portion includes a base plate erected with a cylindrical member brought into contact with a sheet holding member from a lower side thereof and provided with the supply portion reference mark, a pressing plate arranged on an upper side of the cylindrical member for pressing the sheet holding member to a lower side, and moving up and down means for moving up and down the pressing plate, wherein the supply portion reference marks are provided at a plurality of portions across the cylindrical member.

6. The electronic component mounting method according to claim 5, wherein the supply portion imaging camera moving means is controlled based on a result of the image of the supply portion reference mark.

7. The electronic component mounting method according to claim 5, wherein the supply portion imaging camera moving means is controlled based on a result of the image of the supply portion reference mark taken by a calibrating camera moved integrally with the mounting head.

8. An electronic component mounting apparatus for mounting an electronic component supplied by a component supply portion to mount on a board, comprising:

the component supply portion which supplies the electronic component in a predetermined arrangement;

a board holding portion which holds the board;

a component mounting mechanism which mounts the electronic component taken out from the component supply portion by a take out head to the board held by the board holding portion by a mounting head;

a reference mark securely fixed to a main body of the apparatus;

an imaging camera which takes an image of one of the electronic component on the component supply portion and the board to which the electronic component is mounted, and also takes an image of the reference mark;

an imaging camera moving means which horizontally moves the imaging camera;

a controller which controls the component mounting mechanism based on a result of the image of the imaging camera, and controls the imaging camera moving means based on a result of the image of the reference mark, wherein the electronic component is provided to the component supply portion in a state of being adhered on a sheet developed at a sheet holding member, and the component supply portion includes a base plate erected with a cylindrical member brought into contact with the sheet holding member from a lower side thereof and provided with the supply portion reference mark, a pressing plate arranged on an upper side of the cylindrical member for pressing the sheet holding member to a lower side, and moving up and down means for moving up and down the pressing plate, wherein the supply portion reference marks are provided at a plurality of portions across the cylindrical member.

9. The electronic component mounting apparatus according to claim 8, wherein a plurality of reference marks are provided at a plurality of portions, and said controller performs a calibration of a coordinates system of the imaging camera based on a result of the image of the reference marks.

* * * * *